(12) United States Patent
Obernhuber et al.

(10) Patent No.: US 8,999,187 B2
(45) Date of Patent: *Apr. 7, 2015

(54) METHOD FOR MANUFACTURING A DEVICE ON A SUBSTRATE

(71) Applicant: Infineon Technologies AG, Neubiberg (DE)

(72) Inventors: Sandra Obernhuber, Lappersdorf (DE); Christof Jalics, Aalen (DE); Joerg Adler, Regensburg (DE); Uwe Hoeckele, Regensburg (DE); Walter Preis, Regensburg (DE); Reinhard Goellner, Regensburg (DE); Tanja Ippisch, Steinberg am See (DE); Patricia Nickut, Burghausen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/092,624

(22) Filed: Nov. 27, 2013

(65) Prior Publication Data

US 2014/0083973 A1    Mar. 27, 2014

Related U.S. Application Data

(63) Continuation of application No. 12/417,100, filed on Apr. 2, 2009, now Pat. No. 8,597,531.

(51) Int. Cl.
*C03C 15/00*    (2006.01)
*H01L 41/297*    (2013.01)
*H03H 3/04*    (2006.01)

(52) U.S. Cl.
CPC .............. *H01L 41/297* (2013.01); *H03H 3/04* (2013.01)

(58) Field of Classification Search
USPC ........................................................... 216/88
See application file for complete search history.

(56) References Cited

U.S. PATENT DOCUMENTS

| 5,190,613 | A | 3/1993 | Yamagata | |
|---|---|---|---|---|
| 8,597,531 | B2 * | 12/2013 | Obernhuber et al. | 216/88 |
| 2002/0048959 | A1 | 4/2002 | Clevenger et al. | |
| 2002/0102863 | A1 | 8/2002 | Beaman | |
| 2003/0139051 | A1 | 7/2003 | Andideh et al. | |
| 2005/0230677 | A1 | 10/2005 | Wetzel et al. | |
| 2006/0131275 | A1 | 6/2006 | Bian | |
| 2007/0090730 | A1 | 4/2007 | Fukui et al. | |

(Continued)

FOREIGN PATENT DOCUMENTS

| DE | 10200741 A1 | 7/2003 |
|---|---|---|
| DE | 102005058271 A1 | 7/2006 |

(Continued)

*Primary Examiner* — Shamim Ahmed
*Assistant Examiner* — Bradford Gates
(74) *Attorney, Agent, or Firm* — Slater & Matsil, L.L.P.

(57) ABSTRACT

A method for manufacturing a device on a substrate includes forming a layer structure on the substrate, forming an auxiliary layer on the layer structure, forming a planarization layer on the auxiliary layer and on the substrate, exposing the auxiliary layer by a chemical mechanical polishing process and removing at least partly the auxiliary layer to form a planar surface of the remaining auxiliary layer or of the layer structure and the planarization layer. The chemical mechanical polishing process has a first removal rate with respect to the planarization layer and a second removal rate with respect to the auxiliary layer and the first removal rate is greater than the second removal rate.

14 Claims, 9 Drawing Sheets

(56) References Cited

U.S. PATENT DOCUMENTS

| | | |
|---|---|---|
| 2007/0115078 A1 | 5/2007 | Sano et al. |
| 2007/0209174 A1 | 9/2007 | Aigner et al. |
| 2007/0222003 A1 | 9/2007 | Matsushita et al. |
| 2007/0236104 A1 | 10/2007 | Fujii |
| 2007/0254397 A1 | 11/2007 | Fattinger et al. |
| 2007/0254466 A1 | 11/2007 | Nam |
| 2008/0036092 A1 | 2/2008 | Gambino et al. |

FOREIGN PATENT DOCUMENTS

| | | |
|---|---|---|
| DE | 102006019505 A1 | 10/2007 |
| WO | 0229878 A2 | 4/2002 |

\* cited by examiner

METHOD FOR MANUFACTURING A DEVICE ON A SUBSTRATE

This is a continuation application of U.S. application Ser. No. 12/417,100, entitled "Method for Manufacturing a Device on a Substrate" which was filed on Apr. 2, 2009 and issued as U.S. Pat. No. 8,597,531 on Dec. 3, 2013 and is incorporated herein by reference.

BACKGROUND

Embodiments of the present invention relate to a method for manufacturing a device on a substrate.

Embodiments of the present invention relate also to the manufacturing of a device with a highly planar surface. In addition, embodiments relate to a method of manufacturing a patterned highly planar bottom electrode exhibiting an excellent uniformity in layer deposition and a planar surface of the entire bottom electrode.

SUMMARY OF THE INVENTION

Embodiments of the present invention relate to a method for manufacturing a device on a substrate. The method comprises the steps of forming a layer structure on the substrate, forming an auxiliary layer on the layer structure, forming a planarization layer on the auxiliary layer and on the substrate, exposing the auxiliary layer by a chemical mechanical polishing process and removing at least partly the auxiliary layer to form a planar surface of the remaining auxiliary layer or of the layer structure and the planarization layer. The chemical mechanical polishing process comprises a first removal rate with respect to the planarization layer and a second removal rate with respect to the auxiliary layer and the first removal rate is greater than the second removal rate.

BRIEF DESCRIPTION OF THE DRAWINGS

Embodiments of the present invention will be explained in the following with reference to the accompanying drawings, in which.

Before embodiments of the present invention are explained on the basis of the drawings in greater detail in the following, it is pointed out that like elements in the figures are provided with the same or similar reference numerals, and that a repeated description of these elements is omitted.

DETAILED DESCRIPTION OF ILLUSTRATIVE EMBODIMENTS

Figure 1:
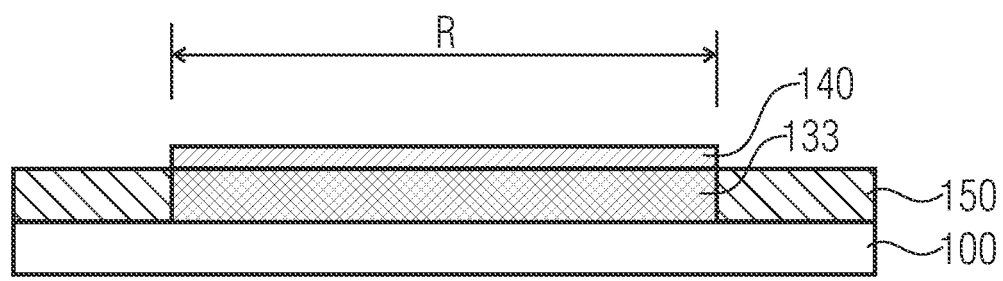
FIG. 1 shows a cross-sectional view of a device during manufacturing according to an embodiment of the present invention.

For many technologies, a defined planarization comprises a critical influence on the quality of the component. It is thus important, for example, to achieve a defined end substrate thickness and/or the most planar surface possible.

Radio-frequency (RF) filters based on BAW resonators are of great interest for many RF applications. There are two concepts for BAW resonators, on the one hand the so-called thin-film BAW resonator (FBAR), and the so-called solidly mounted resonator (SMRs). Thin-film BAW resonators include a membrane on which a layer sequence comprising a lower electrode, a piezoelectric layer, and an upper electrode is arranged. In the alternative concept of solidly mounted resonators, an SMR comprises a substrate, such as, for example, a silicon substrate, on which the layer sequence comprising the lower electrode, the piezoelectric layer, and the upper electrode is arranged. In order to keep the acoustic waves in the active region in this design, a so-called acoustic minor is needed. It is located between the active layers, i.e., the two electrodes and the piezoelectric layer, and the substrate.

In both concepts for BAW resonators, the deposition of a piezoelectric layer on a patterned bottom electrode is needed, the bottom electrode being exemplarily made of a metal. A uniformed deposition is thus of crucial importance for the quality of the resonator. To allow a uniformed deposition, it is desired to have a highly planar wafer surface and, in particular, a bottom electrode comprising a highly planar surface before depositing the piezoelectric layer. Thus, growth edges in the piezoelectric layer are avoided and a high quality of the piezo material is made possible. This results in a high electromechanical coupling and a high acoustic quality. In addition, subsequent process steps are made easier by a planar surface. This particularly applies to patterning the upper electrode.

The conventional methods are problematic in that an oxide CMP (Chemical Mechanical Polishing) step affects the surface of the bottom electrode. This results in a so-called "dishing" effect, a local variation of the electrode thickness. This also results in local variations of the piezo layer thickness deposited on the bottom electrode. Since the resonant frequency of the BAW resonator, except for the material of the piezo layer, is basically given by the layer thickness of the piezo layer, the local variation of the electrode thickness results in a widening of the series resonance of the BAW resonator, resulting in a considerable decrease in the series quality of the BAW resonator.

Therefore, there is a need to provide an improved method for manufacturing, for example, a patterned bottom electrode in a piezoelectric device.

Hence, in the case of a BAW filter, this applies to the planarization of the lower electrode. The resonance frequencies are determined here by the substrate stack, and a topology in the active area should thus be as planar as possible. It is of great significance that the planarization of the lower electrode be as defined as possible, since it is important for the performance of the component that this layer is as planar as possible. In addition, no additional layers may exist between electrodes and piezo material. A slight variation of the substrate thickness results in a shift in the resonance frequency leading to a reduced resonator quality, and to the excitation of spurious modes.

There are various technical approaches to leveling, for example, simple CMP, BPSG melt (BPSG=borophosphosilicate-glass), etc. These frequently fail to achieve the desired quality. In the case of simple CMP, for example, said dishing occurs, and structures are attacked.

Embodiments of the present invention suggest protecting important layers by an extra layer or a substrate stack. The structure to be created is hence protected with an auxiliary layer, which exhibits a high selectivity vis-à-vis the CMP process employed. A layer or a substrate stack is also possible here. Two fundamental principles are conceivable here:

(a) the auxiliary layers are again removed after planarization, or (b) the auxiliary layers remain at least partly on the structure.

Embodiments of the present invention therefore rely on a selectivity of the auxiliary layer, vis-à-vis, with respect to the CMP process.

FIG. 1 shows a cross-section of a device manufactured according to an embodiment. A layer structure 133 is arranged on a substrate 100 over a region R. In addition, a planarization layer 150 is arranged on the substrate 100 essentially flush with the layer structure 133. On top of the layer structure 133, an auxiliary layer 140 is arranged to protect the layer structure 133. According to embodiments of the present invention, the auxiliary layer 140 comprises a lower removal rate than the removal rate of planarization layer 150 under a mechanical process to remove material. As a consequence, in the process of mechanically removing, more material is removed from the planarization layer 150 than is removed from the auxiliary layer 140. Thus, the auxiliary layer 140 protects the layer structure 133 under the mechanical removing process, which may, for example, comprise a CMP process. The removal rate can be defined as the amount of removed material per time unit (e.g., the decreased layer thickness per second). The layer structure 133 may also be a layer sequence comprising different layers.

FIGS. 2a to 2e show a conventional process for planarization of a layer structure 133.

Figure 2A:
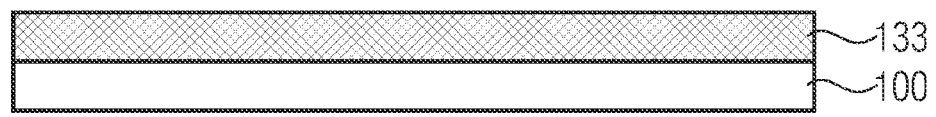
FIGS. 2a to 2e show conventional processing steps in manufacturing.

FIG. 2a shows a first step in which a layer structure 133 is formed on the substrate 100.

Figure 2B:
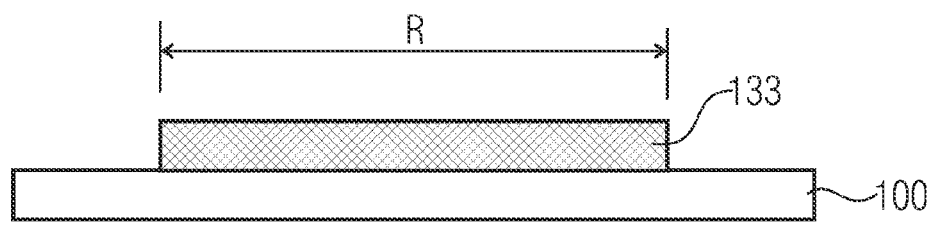

FIG. 2b shows as next step, a structuring of the layer structure 133, so that the layer structure 133 covers a region R on the substrate 100.

Figure 2C:
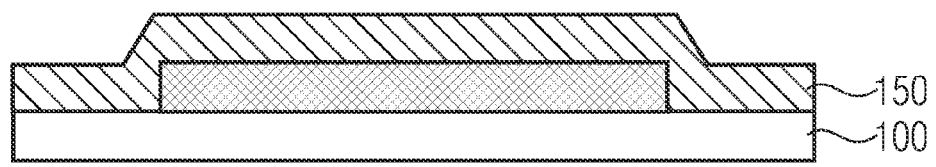

FIG. 2c shows the following step, in which a planarization layer 150 is arranged on the substrate 100 and on the layer structure 133. The planarization layer 150 comprises a layer thickness, which corresponds approximately with the layer thickness of the layer structure 133.

In a next step (FIG. 2d) the planarization layer 150 is removed over a further region 170, which is smaller, or inside the region R, so that the layer structure 133 is exposed over the region 170. Since the further region 170 is smaller than the region R, the planarization layer 150 leaves a first stud 150a and a second stud 150b on top of the layer structure 133. Both studs 150a and 150b may of course be connected along the direction perpendicular to the drawing plane (not shown in the figure).

In a last step (FIG. 2e) the studs 150a and 150b are removed, which is performed by a mechanical polishing, such as, for example, a CMP process. As a result of the CMP process, the studs 150a and 150b are removed leaving, on the one hand a first and a second rounding-off 151a, 151b, at the edges of the layer structure 133, and on the other hand yield a dishing 153 in the middle of the layer structure 133. The dishing 153 may comprise, for example, a continuous recess such that the thickness of the layer structure 133 is smaller in the middle than towards its edges. As a consequence, the layer structure 133 does not exhibit a planar surface resulting in the aforementioned disadvantages.

Figure 2D:
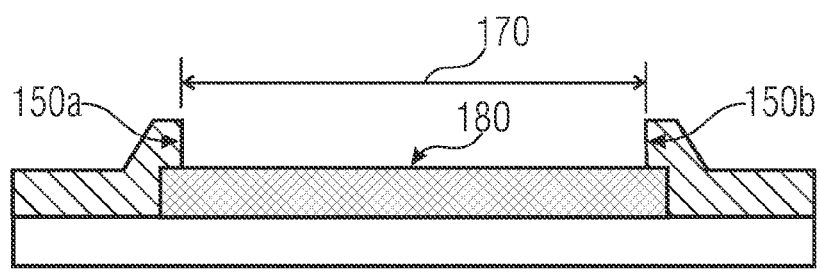
Figure 2E:
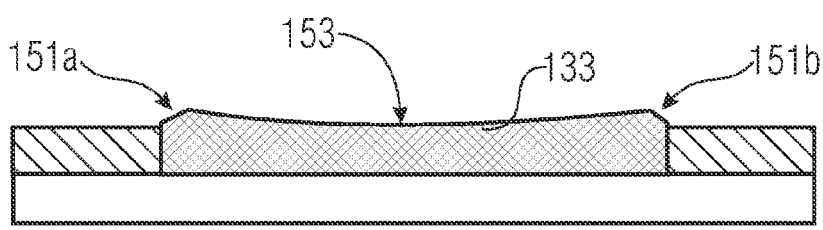

In the context of the exemplarily BAW filter, this conventional planarization of the lower electrode can be rephrased as follows. The layer structure 133 comprises electrode layers, which are deposited, structured, and the oxide (planarization layer 150) is deposited (FIGS. 2a to 2c). This is opened in the area R of the electrodes (e.g., by an etching process) and the remaining oxide studs 150a, 150b at the edges of the electrodes are then polished away (FIGS. 2d and 2e).

This conventional procedure comprises a number of disadvantages, which result in an inhomogeneous layer. Opening of the planarization oxide causes the surface of the electrode to be attacked during the etching process and oxidized upon subsequent removal of the resist. Depending on the etching process, this leads to a smaller step in the area of the oxide studs, and an oxidized electrode surface exhibits higher erosion during the subsequent CMP. Furthermore, the surface is not evenly polished during the polishing process. This is generally known as dishing 153. In the case of the BAW resonators, especially the center of the electrode surface is more intensively polished here, and longer polishing does not result in rounding-off of the edges. This leads to inhomogeneous layers and thus to a deterioration in the quality of the component. In addition, the process window here is relatively small.

FIGS. 3a to 3f show a first embodiment for processing a planarized surface for a device.

Figure 3A:
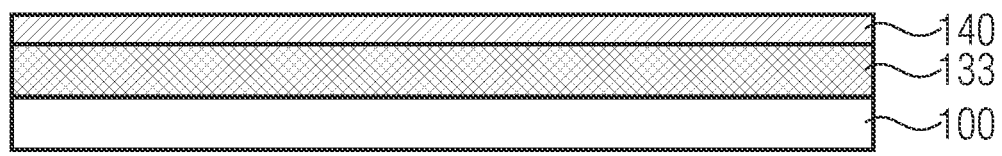
FIGS. 3a to 3f show processing steps for a method according to a first embodiment of the present invention.

FIG. 3a shows the layer structure 133 being arranged on the substrate 100. In this first embodiment the auxiliary layer 140 is arranged on the layer structure 133 prior to the structuring of the layer structure 133.

Figure 3B:
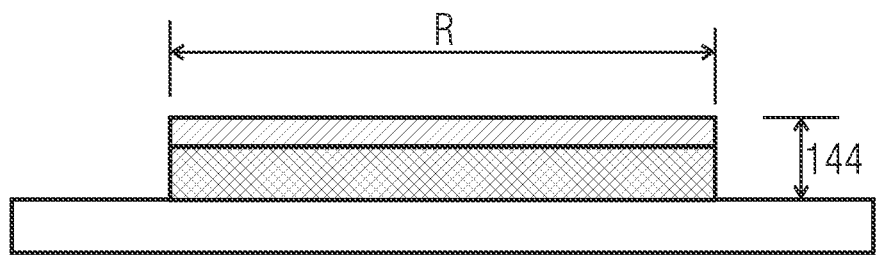

FIG. 3b shows as the next step the structuring of the layer structure 133 together with the auxiliary layer 140. As result, the layer structure 133 and the auxiliary layer 140 extend over the region R and are removed outside the region R exposing the substrate 100. The layer structure 133 together with the auxiliary layer 140, comprise a layer thickness 144. The region R may comprise, for example, later on the active area of the resonator or the active region is inside the region R.

Figure 3C:
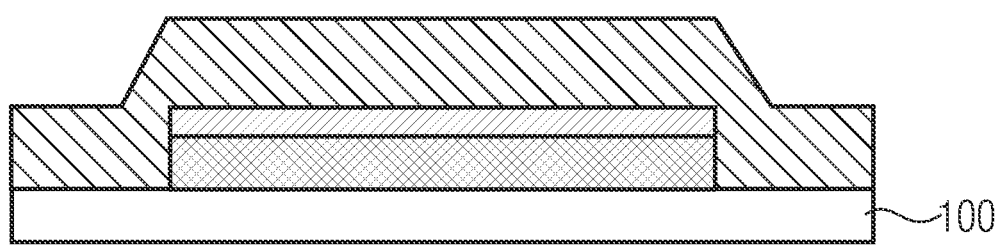

FIG. 3c shows the following step in which the planarization layer 150 is formed on the substrate 100 and the auxiliary layer 140. The planarization layer 150 is arranged with an approximate thickness 144 and extends on both sides of the region R along the substrate 100.

Figure 3D:
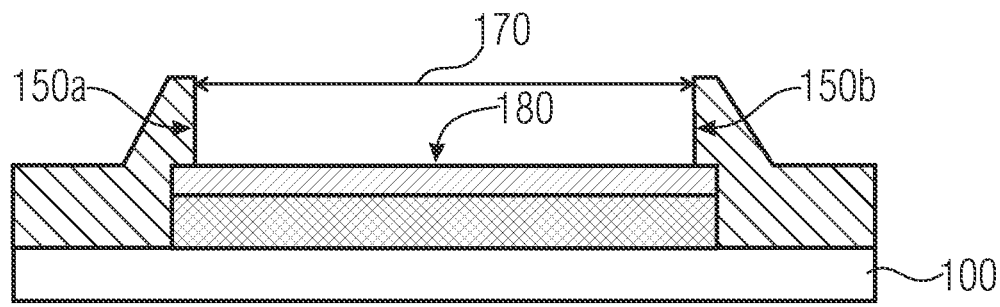

FIG. 3d shows the next step in which the auxiliary layer 140 is exposed along a region 170. The region 170 may, for example, again be smaller than the region R, so that a first and a second stud 150a, 150b remains on top of the auxiliary layer 140. This removal can, for example, be performed by an etching step, in which the auxiliary layer 140 acts as an etch stop layer. As a result, a surface 180 of the auxiliary layer 140 is exposed.

Figure 3E:
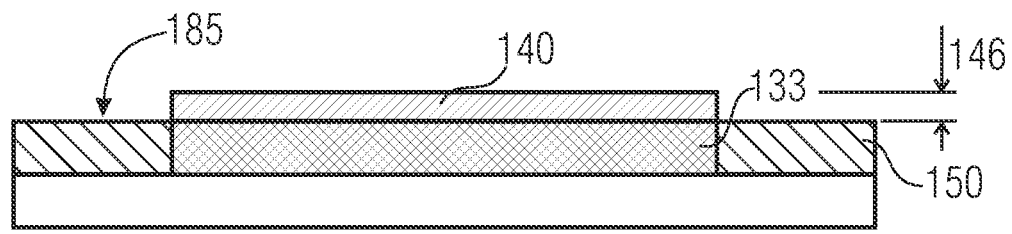

FIG. 3e shows the next step in which the studs 150a, 150b are removed and, in addition, also part of the planarization layer 150 is removed on both sides of the region R. As a consequence, the planarization layer 150 comprises a layer thickness, which is by an amount 146 smaller than thickness 144 of the layer structure 133 together with the auxiliary layer 140. The amount 146 is adjusted such that the thickness of the auxiliary layer 140. As a result, a surface 185 of the planarization layer 150 is exposed. The removal of the planarization layer 150 may comprise a mechanical process such as, for example, a CMP step and it is needed that the auxiliary layer 140 comprises a lower removal rate than the removal rate of the planarization layer 150 under the mechanical process.

Figure 3F:
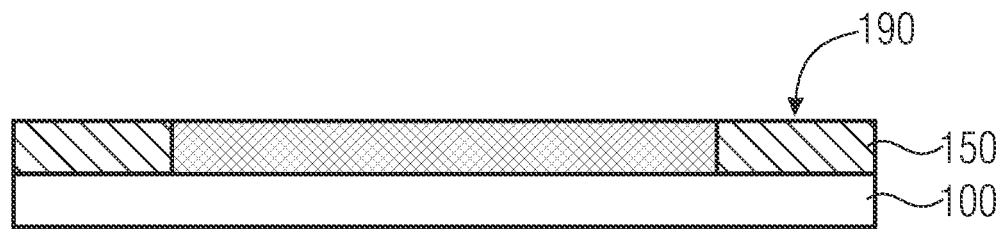

FIG. 3f shows as final step the removal of the auxiliary layer 140. The result is a planar surface 190, along which the layer structure 133 is flush with the planarization layer 150 on both sides providing a highly planar surface 190. The removal of the auxiliary layer 140 may differ from the mechanical process used in removing the planarization layer 150 so that the material of the auxiliary layer 140 is selectively removed.

FIGS. 4a to 4f show another embodiment of the present invention.

FIG. 4a shows again the starting point, wherein the layer structure 133 is arranged on the substrate 100.

Figure 4A:
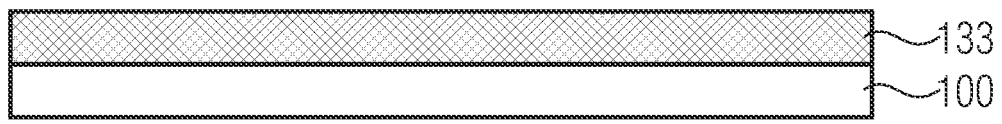
FIGS. 4a to 4f show process steps for a method according to a second embodiment.
Figure 4B:
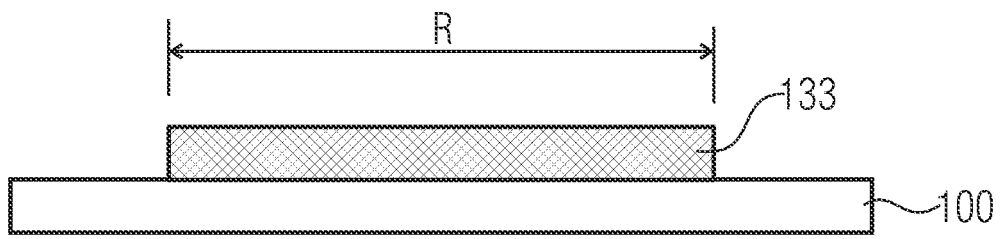

As a next step, FIG. 4b shows a structuring of the layer structure 133, so that the layer structure 133 extends over a region R over the substrate 100.

Figure 4C:
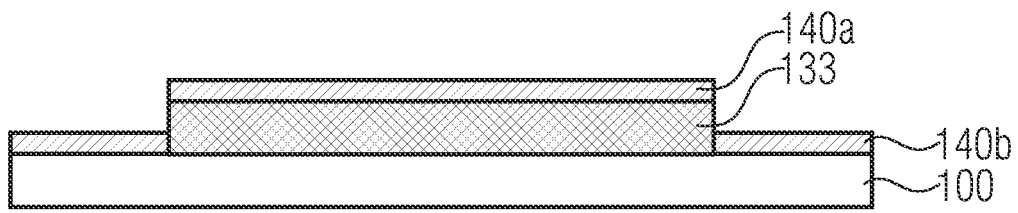

FIG. 4c shows the deposition of the auxiliary layer 140 on the layer structure 133 and the substrate 100. As a result, the auxiliary layer 140 comprises a first part 140a extending over the layer structure 133, and a second part 140b extending over the substrate 100. As a consequence, in this embodiment the layer structure 133 is between the substrate 100 and the first part of the auxiliary layer 140a, and the second part of the auxiliary layer 140b extends laterally on both sides of the layer structure 133.

Figure 4D:
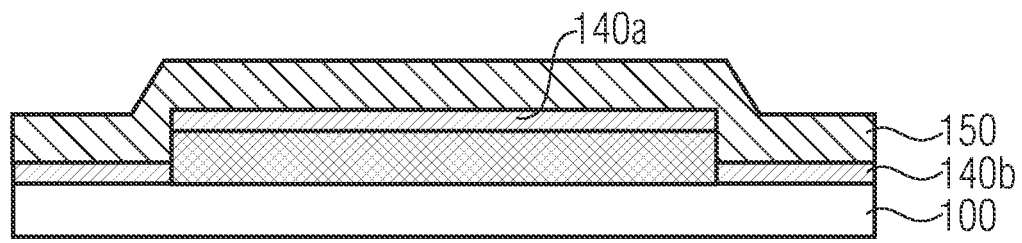

FIG. 4d shows the next step in which the planarization layer 150 is arranged on the first part 140a of the auxiliary layer 140 and on the second part 140b of the auxiliary layer 140. Again, the thickness of the planarization layer 150 may be arranged such that the thickness of the layer structure 133 corresponds approximately to the thickness of the planarization layer 150.

Figure 4E:
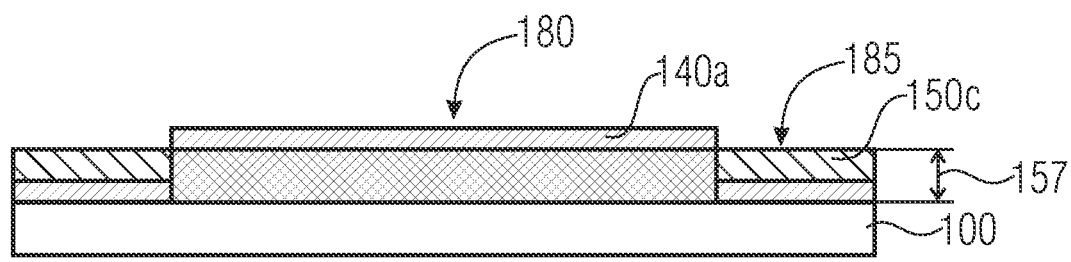

FIG. 4e shows as the next step the removal of the planarization layer 150 on top of the first part of the auxiliary layer 140a and partly above the second part of auxiliary layer 140b so that a remaining part of the planarization layer 150c remains partly on the second part of the auxiliary layer 140b. As a result, a surface 180 of the first part of the auxiliary layer 140a and a surface 185 of the planarization layer 150 is exposed. The removal of the planarization layer 150 may again comprise a mechanical removing as, for example, a CMP process and may be arranged in a manner that the remaining part of the planarization layer, together with the second part of the auxiliary part 140b, comprises a thickness 157 which corresponds approximately with the thickness of the layer structure 133.

Figure 4F:
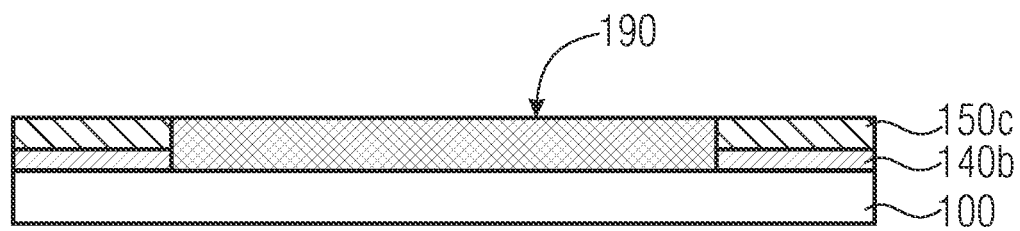

FIG. 4f shows as a final step the selective removal of the first part of the auxiliary layer 140a, so that the remaining parts 150c of the planarization layer 150 is flush with the layer structure 133 providing a highly planar surface 190. The second part of the auxiliary layer 140b remains between the substrate 100 and the remaining part of the planarization layer 150c.

The first embodiment as shown in FIG. 3 and the second embodiment as shown in FIG. 4 may be applied to any layer structure 133, which should be planarized or flush to a planarization layer 150. As a specific example, the layer structure 133 may comprise a lower electrode of a piezoelectric device and, in addition, may comprise a plurality of layers.

FIGS. 5a to 5h show the example of a lower electrode or the planarization of a lower electrode in more detail.

Figure 5A:
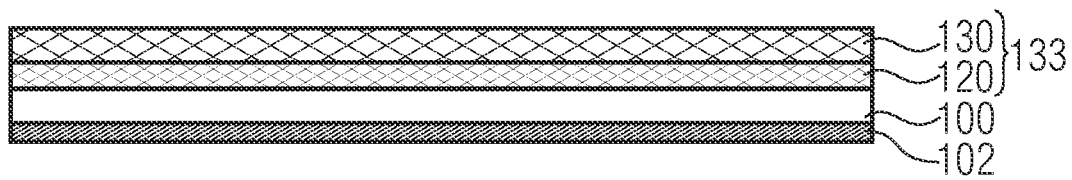
FIGS. 5a to 5h show processing steps for manufacturing a piezoelectric device.

FIG. 5a shows a starting layer arrangement. The substrate 100 is arranged between a ground layer 102 and the layer structure 133, wherein the layer structure 133 comprises two layers, a first conductive layer 120, and a second conductive layer 130.

Figure 5B:
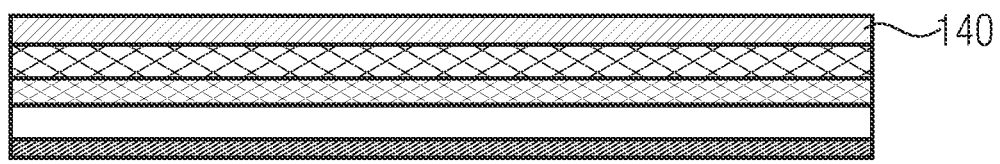
Figure 5C:
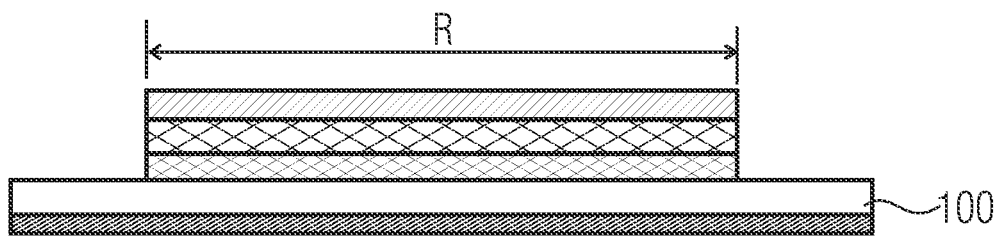
Figure 5D:
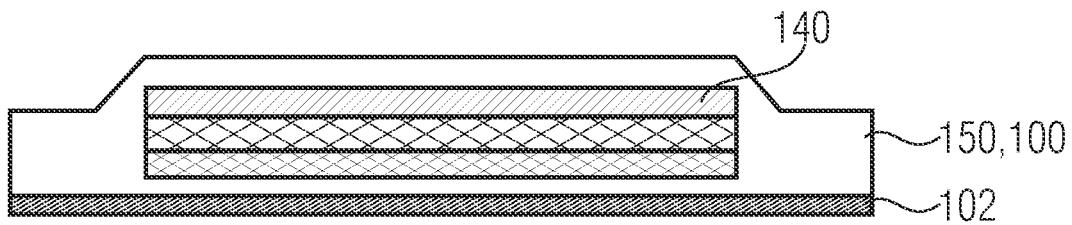

FIG. 5b shows the next step in which the auxiliary layer 140 is arranged on top of the layer structure 133.

FIG. 5c once again shows the step in which the layer structure 133 together with the auxiliary layer 140, is structured so that a region R, which again may comprise the active region of the resonator, is defined. This step may comprise a lithographic process by using a mask layer.

As the next step (FIG. 5d) the planarization layer 150 is arranged on the substrate 100 and on the auxiliary layer 140 together with the layer structure 133. The substrate 100 and the planarization layer 150 may comprise a same or similar material, in which case the layer structure 133 together with the auxiliary layer 140 are embedded in the resulting combined structure 150, 100.

Figure 5E:
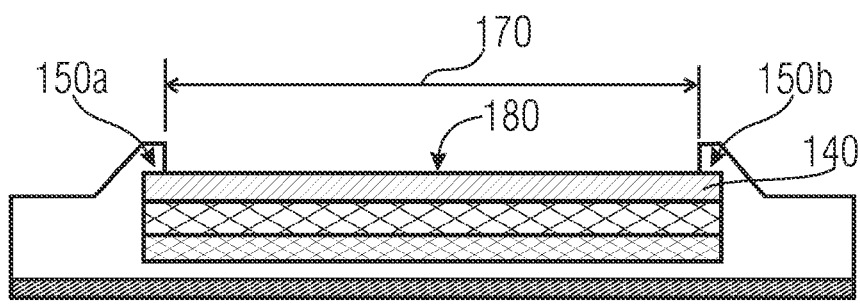

FIG. 5e shows as next step the opening of the planarization layer 150 along the region 170 so that the surface 180 of the auxiliary layer 140 is exposed. In case the opening region 170 is smaller than the region R, again a first stud 150a and a second stud 150b remain on top of the auxiliary layer 140.

Figure 5F:
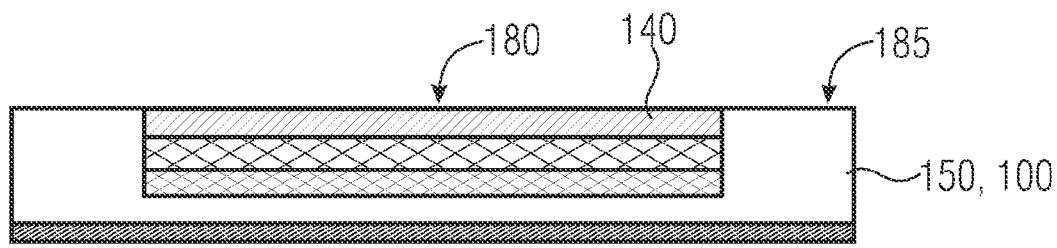

FIG. 5f shows the step in which the studs 150a, 150b are removed. This process of removing may, for example, comprise a mechanical polishing, such that the surface 180 is flush with a surface 185 of the planarization layer 150.

Figure 5G:
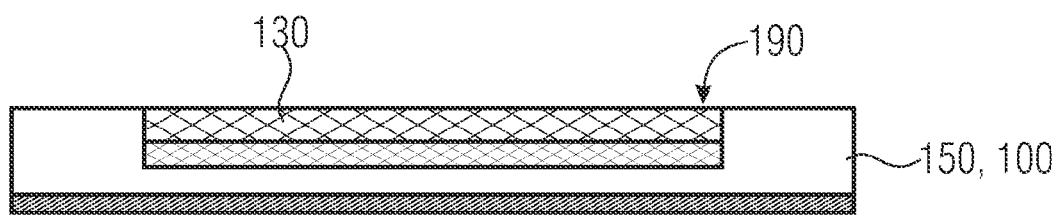

FIG. 5g shows the next step, in which the auxiliary layer 140 and part of the planarization layer 150 are removed such that the second conductive layer 130 is exposed and forms together with the remaining planarization layer 150c a highly planar surface 190.

Figure 5H:
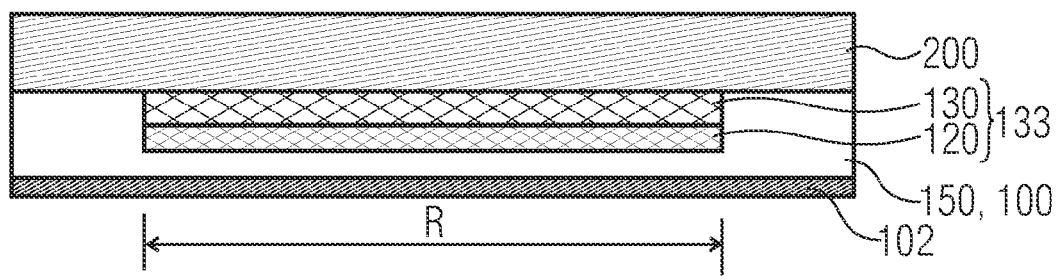

FIG. 5h shows as final step the deposition of a piezoelectric layer 200 on the highly planar surface 190. The layer structure 133 can be electrically connected to a controlling device (not shown) so that it becomes a lower electrode for a piezoelectric device. On top of the piezoelectric layer 200, a top electrode may be arranged along the region R in order to define a BAW device (not shown in FIG. 5h).

Figure 6:
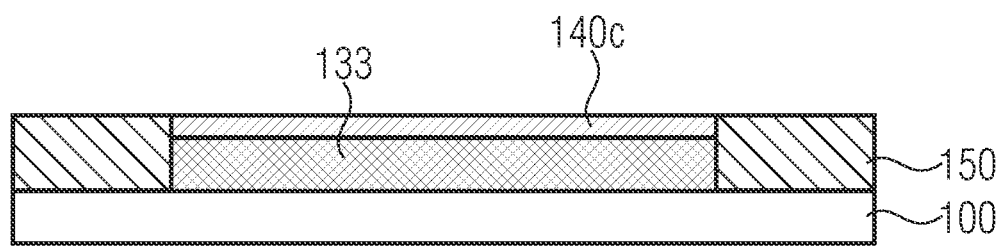
FIG. 6 shows an embodiment comprising a layer structure with a seed layer according to a further embodiment.

FIG. 6 shows a further embodiment, in which a remaining part 140c of the auxiliary layer 140 is still present on the layer structure 133 arranged on the substrate 100. In this embodiment, the auxiliary layer 140 may not be removed completely from the layer structure 133, but the remaining part 140c is left, which may act as a seed layer for the subsequent layer (e.g., the piezoelectric layer) to be deposited on it. Alternatively, the seed layer 140c can also be an additional layer of different material formed between the auxiliary layer 140 and the layer structure 133.

According to this embodiment, on both sides of the seed layer 140c, as well as the layer structure 133, remaining parts of the planarization layer 150c are flush with the seed layer 140c. The seed layer 140c may, for example, comprise a material on which the remaining layers can be grown upon. For example, on amorphous Silicon a piezoelectric layer can be grown and hence may provide a possible choice for the seed layer 140c. In order to obtain the layer structure 133 as shown in FIG. 6, the process steps as shown in FIGS. 3a to 3d may be repeated with the difference that the planarization layer 150 remains present laterally on both sides of the seed layer 140c. Alternatively, the process steps as shown in FIGS. 4a to 4d may also be repeated to obtain the structure as shown in FIG. 6, in which case, between the remaining parts 150c of the planarization layer 150 and the substrate 100, the second part 140b of the auxiliary layer would be present.

The embodiments with (shown in FIG. 6) or without seed layer 140c (shown in FIG. 4f, or 3f) rely on the removal process of the protective layer 140. In case it can be optimized with respect to the electrode surface (the layer structure 133) so that no attack occurs, the variant without the seed layer 140c may be preferred, especially as the seed layer 140c may have drawbacks with respect to the characteristics of the resulting device. It cannot be completely ruled out that as a result of this process sequence the seed layer will change in its structure and the growth of the piezoelectric layer may not be optimal.

If part of the auxiliary layer 140 remains at the seed layer 140c on the layer structure 133, the layer thickness should be adjusted in a manner that the filter property, when, for example, being used within a BAW filter, is not significantly altered.

To summarize, the planarization described in the different embodiments make use of the auxiliary layer 140.

In the first embodiment, as shown in FIG. 3, the protective layer 140 was applied to the electrode 133, which is still in an unstructured form and structured in conjunction with the electrode 133. The planarization layer 150 (may comprise an oxide) is then deposited, opened over the electrode surface 180, and planarized with the aid of, for example, the CMP process. The protective layer 140 is once again removed as shown in FIG. 3, or a layer of protective layer is left on the electrode 133.

In the second embodiment (see FIG. 4) the protective layer 140 is deposited after structuring of the electrodes. Here, the planarization oxide 150 is subsequently deposited at a suitable thickness and planarized without opening the oxide 150 over the region R. This variant provides the advantage of saving one photo technology step.

In order to achieve the desired result (highly planar surface 190), it is important to choose the material for the auxiliary layer 140 appropriately. In conventional methods, the material of the auxiliary layer 140 comprises silicon-nitrate, which however does not comprise the desired selectivity with respect to the CMP process.

A better material for the auxiliary layer 140 is, for example, carbon. The use of carbon comprises the advantage that this material is very hard, and is scarcely attacked during the planarization, i.e., it may serve as a CMP stop layer. In addition, carbon is also very easy to remove. The amount of carbon may, for example, be such that 10% to 60% or about 20% or about 50% or at least 90% of the auxiliary layer 140 is carbon. A possible means for removing the carbon should not involve an oxygen environment, as the surface of the electrode is oxidized when exposed to oxygen. This is important especially for the embodiments, in which the protective layer 140 is fully removed.

In general, the materials are selected taking into account the selectivity with respect to a CMP process. The ratio between the removal rates of the planarization layer 150 (first removal rate) compared to the removal rate of the auxiliary layer 140 (second removal rate) may comprise a value greater than 100:1, or greater than 50:1, or greater than 20:1. This means that the first removal rate is, for example, greater than 100 times than the second removal rate, or the first removal rate is greater than 50 times the second removal rate, or the first removal rate is greater than 20 times the second removal rate. Such selectivity may be reached if the planarization layer 150 comprises, for example, silicon-oxide, and the auxiliary layer 140 comprises said carbon.

In addition, as said above, the auxiliary layer 140 should be selectively removable from the layer structure 133, meaning that the structure 133 to be protected will not be damaged by the removal of the auxiliary layer 140. For example, in order to remove the auxiliary layer 140, a non-oxidizable material may be used, and may for instance be performed within a hydrogen surrounding. If, for instance, the upper layer of electrode material (second conductive layer 130) comprises tungsten, nitrogen-hydrogen ($N_2H_2$) may be used and if the upper layer of the electrode comprises, for example, aluminum, also oxygen or hydrogen can be used.

On the other hand, if the seed layer 140c is used (shown in FIG. 6) the seed layer 140c provides already a protection for the layer structure 133. For the seed layer 140c, an amorphous silicon layer may be used and may be deposited under a carbon CMP stop layer (as auxiliary layer 140), and the process carried out is as described above. After the removal of the carbon layer 140, the amorphous silicon layer 140c remains behind. In a standard process this layer is likewise deposited on the electrode 133, and serves as a seed layer for the piezoelectric layer. This variant would have the advantage that the tungsten layer is already protected directly after the deposition.

If the layer sequence 133 becomes the bottom electrode the following materials may be arranged as layers. A first layer comprises, for example, aluminum, an intermediate layer comprising for example of titanium nitride, and a last layer comprising, for example, of tungsten, which are arranged such that the tungsten layer and the aluminum layer are arranged on both sides of the titanium nitride layer. The tungsten layer is then the upper layer on which the auxiliary layer 140 is arranged.

What is claimed is:

1. A method for manufacturing a device on a substrate, the method comprising:
    forming a layer structure on the substrate;
    forming an auxiliary layer on the layer structure;
    forming a planarization layer on the auxiliary layer and on the substrate;
    exposing the auxiliary layer and the planarization layer to a chemical mechanical polishing process, wherein a top surface of the planarization layer around the auxiliary layer is coplanar with a top surface of the layer structure after the chemical mechanical polishing process, wherein the chemical mechanical polishing process comprises a first removal rate with respect to the planarization layer and a second removal rate with respect to the auxiliary layer, and wherein the first removal rate is greater than the second removal rate; and
    selectively removing the auxiliary layer to form a substantially planar surface of remaining auxiliary layer or of the layer structure and the planarization layer.

2. The method of claim 1, wherein the first removal rate is greater than 20 times the second removal rate.

3. The method of claim 2, wherein the first removal rate is greater than 50 times the second removal rate.

4. The method of claim 3, wherein the first removal rate is greater than 100 times the second removal rate.

5. The method of claim 1, wherein the auxiliary layer comprises carbon.

6. The method of claim 1, wherein exposing the auxiliary layer comprises exposing the auxiliary layer within a non-oxidizing environment.

7. The method of claim 6, wherein the non-oxidizing environment comprises hydrogen or nitrogen-hydrogen.

8. The method of claim 1, wherein exposing the auxiliary layer comprises performing an etching step to expose a region, the chemical mechanical polishing process being performed after the etching step.

9. The method of claim 8, wherein at least partly removing the planarization layer leaves studs on the auxiliary layer and wherein the chemical mechanical polishing process is performed such that the studs are removed.

10. A method for manufacturing a lower electrode of a piezoelectric device on a substrate, the method comprising:
    forming a layer structure on the substrate, wherein the layer structure comprises a conductive material;
    forming an auxiliary layer on the layer structure;
    forming a planarization layer on the auxiliary layer and on the substrate;
    exposing a portion of the auxiliary layer;
    applying a chemical-mechanical-polishing such that the planarization layer comprises a smaller thickness than a layer thickness of both the auxiliary layer and the layer structure,
    wherein, after the chemical-mechanical-polishing, the thickness of the planarization layer is the same as a thickness of the layer structure; and selectively removing the auxiliary layer to form a substantially planar surface of the auxiliary layer and the planarization layer.

11. The method of claim 10, wherein the auxiliary layer comprises a material comprising a lower removal rate than a removal rate of the planarization layer with respect to the chemical-mechanical-polishing.

12. A method for manufacturing a device on a substrate, the method comprising:
   forming a layer sequence on the substrate;
   structuring the layer sequence by exposing part of the substrate to define a region;
   forming a first part of an auxiliary layer on the structured layer sequence and a second part of the auxiliary layer on the part of the substrate;
   forming a planarization layer on the first and second part of the auxiliary layer;
   exposing the first part of the auxiliary layer by performing chemical-mechanical-polishing, wherein the chemical-mechanical-polishing comprises a first removal rate with respect to the planarization layer and a second removal rate with respect to the auxiliary layer and wherein the first removal rate is greater than the second removal rate, wherein a thickness of the layer sequence is about equal to a combined thickness of the remaining planarization layer and the second part of the auxiliary layer; and
   removing the first part of the auxiliary layer from the layer sequence to form a substantially planar surface of the layer structure with the planarization layer.

13. The method of claim 12, wherein the first part of the auxiliary layer comprises carbon.

14. The method of claim 12, further comprising depositing a layer on the substantially planar surface.

* * * * *